(12) United States Patent
Cook

(10) Patent No.: US 7,387,531 B2
(45) Date of Patent: Jun. 17, 2008

(54) UNIVERSAL COAXIAL CONNECTOR

(75) Inventor: Christopher J. Cook, Hickory, NC (US)

(73) Assignee: Commscope, Inc. of North Carolina, Hickory, NC (US)

( * ) Notice: Subject to any disclaimer, the term of this patent is extended or adjusted under 35 U.S.C. 154(b) by 0 days.

(21) Appl. No.: 11/465,057

(22) Filed: Aug. 16, 2006

(65) Prior Publication Data

US 2008/0045080 A1     Feb. 21, 2008

(51) Int. Cl.
*H01R 9/05*       (2006.01)
(52) U.S. Cl. ...................... 439/578; 439/584
(58) Field of Classification Search ............... 439/578, 439/583–585, 440
See application file for complete search history.

(56) References Cited

U.S. PATENT DOCUMENTS

| | | | |
|---|---|---|---|
| 4,447,107 A | | 5/1984 | Major, Jr. |
| 4,773,879 A | * | 9/1988 | Pauza ......................... 439/579 |
| 4,854,893 A | * | 8/1989 | Morris ....................... 439/578 |
| 4,897,046 A | * | 1/1990 | Tengler et al. ............. 439/579 |
| 5,098,314 A | * | 3/1992 | Castagna et al. ........... 439/578 |
| 5,171,164 A | * | 12/1992 | O'Neil et al. ............... 439/552 |
| 5,435,745 A | | 7/1995 | Booth |
| 5,529,522 A | * | 6/1996 | Huang ........................ 439/460 |
| 5,700,160 A | * | 12/1997 | Lee ............................. 439/578 |
| 5,769,662 A | * | 6/1998 | Stabile et al. .............. 439/578 |
| 5,820,408 A | | 10/1998 | Wang |
| 6,015,315 A | | 1/2000 | Ensign |
| 6,428,356 B1 | * | 8/2002 | Dole .......................... 439/578 |
| 6,575,784 B1 | * | 6/2003 | Yamada ...................... 439/578 |
| 6,733,336 B1 | * | 5/2004 | Montena et al. ........... 439/578 |
| 6,776,657 B1 | * | 8/2004 | Hung .......................... 439/578 |
| 6,808,415 B1 | * | 10/2004 | Montena ..................... 439/584 |
| 6,890,208 B2 | * | 5/2005 | McCarthy ................... 439/394 |
| 6,976,872 B1 | | 12/2005 | Wild |
| 2002/0119699 A1 | | 8/2002 | Leve |
| 2002/0164900 A1 | | 11/2002 | Youtsey |
| 2005/0079761 A1 | | 4/2005 | Rodrigues |

OTHER PUBLICATIONS

Kuester, Common Coaxial Connectors, Sep. 2000.
Corning-Gilbert, Inc., UltraEase™ ID Compression Connector, May 2005.
Corning-Gilbert, Inc., UltraEase™ Series Install Guide for "F" 59 and 6, Sep. 2003.

* cited by examiner

*Primary Examiner*—Tho D. Ta
*Assistant Examiner*—Travis Chambers
(74) *Attorney, Agent, or Firm*—Muncy, Geissler, Olds & Lowe, PLLC

(57) ABSTRACT

A connector for coaxial cable, including a substantially tubular body; a gripping barrel, arranged inside the body, having a hoop near one end and a plurality of staves extending from the hoops; and an adapter sleeve arranged at least partly inside the body for supporting the cable inside the body.

20 Claims, 2 Drawing Sheets

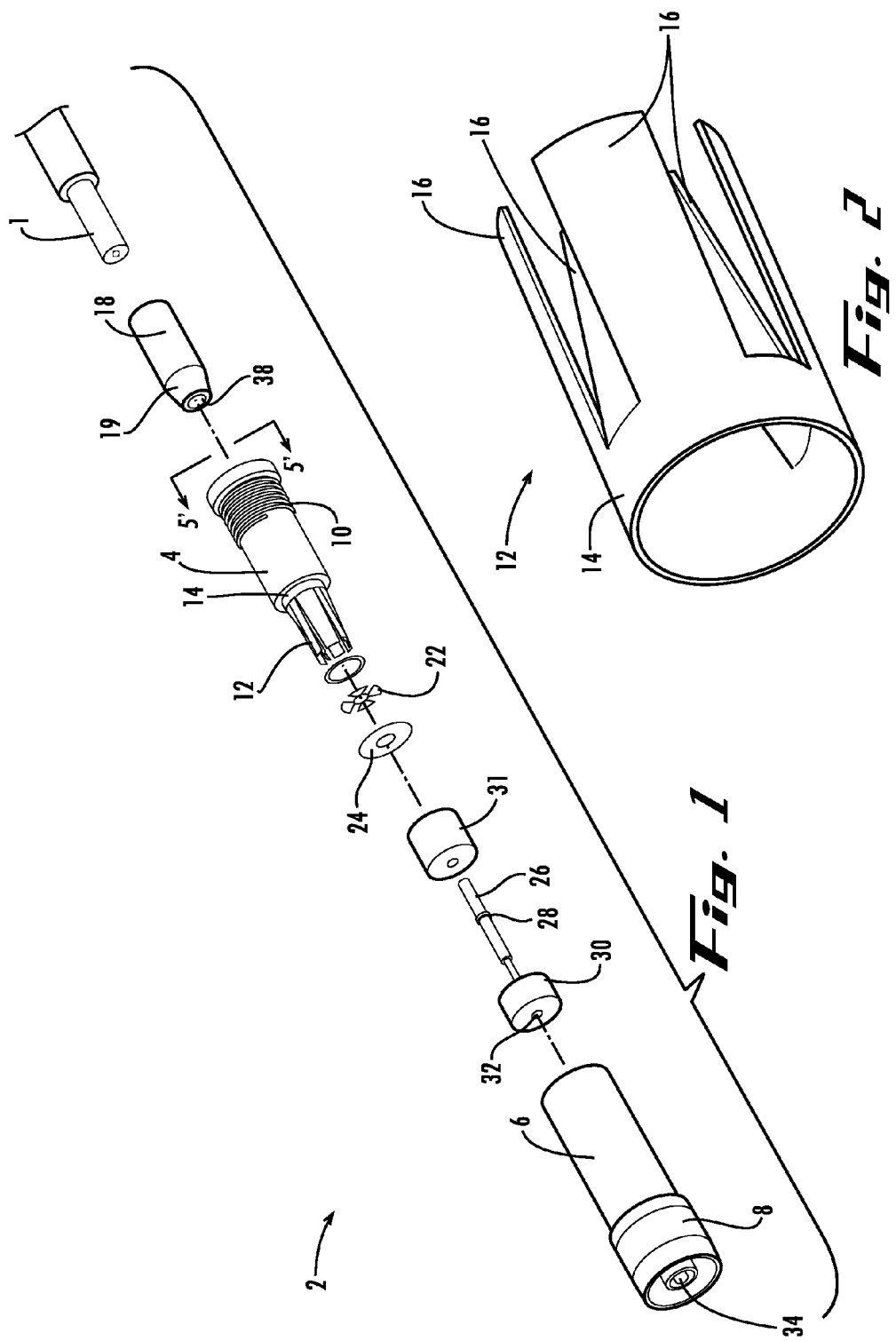

UNIVERSAL COAXIAL CONNECTOR

BACKGROUND

1. Technical Field

The technology disclosed here generally relates to electrical connectors including, or for use with, coaxial cable.

2. Description of Related Art

Coaxial cable typically consists of a conducting wire surrounded by an insulating dielectric material, an outer conductor, and another insulating layer referred to as the jacket. It is often used as a high-frequency transmission line to carry so-called "broadband" signals having a relatively wide range of frequencies. In this regard, coaxial cables must be tested for various electrical properties that can vary depending upon the intended transmission frequency.

In the "CATV" cable television industry, where coaxial cable is designed around a nominal 75-ohm impedance requirement, there are two basic types of connectors. The first type is the field connector which is used primarily in residential and commercial dwellings as a means to carry CATV signals from the distribution line to these dwellings.

There are basically two types of field connectors. The first type of field connector is the crimp-type. The crimp-type field connector slides onto a prepared cable end and the outer body is deformed by a crimping tool that secures the connector to the cable. The second type of field connector is the compression-type. This type of field connector is prepared in much the same manner as the crimp-type, with the exception that a plastic sleeve with O-ring is slid over the jacket prior to insertion of the cable into the connector body. After the connector is installed, a compression tool slides the plastic sleeve and O-ring into the connector body and snaps into place securing the connector and cable.

In addition to field connectors, the CATV industry also uses test connectors. Test connectors are generally slip-on type connectors that are not mechanically secured to the cable during testing. These connectors are intended for quick and easy installation, while providing fairly accurate results while undergoing various electrical testing.

For example, during manufacture, and/or at other times during the installation process, lengths of cable may be connected to various test analyzers. These cable testing devices must be quickly and easily connected to cables of varying sizes. Consequently, conventional cable test systems often require a separate adapter for connecting each size of cable to the test apparatus. Use of such multiple connectors can significantly slow the testing process. Furthermore, each of these adapters may have its own electrical characteristics which must be accounted for during the testing process. For example, so-called "stray" or parasitic capacitance which is introduced by the connector can significantly affect the test results and is therefore preferably minimized in the connector.

SUMMARY

Various drawbacks of such conventional technology are addressed here by providing a connector for coaxial cable, including a substantially tubular body; a gripping barrel, arranged inside the body, having a hoop near one end and a plurality of staves extending from the hoop; and an adapter sleeve arranged at least partly inside the body for supporting the cable inside the body. The body may include an insert for receiving the gripping barrel in one end and the adapter sleeve in another end; and a receptacle, having a fastener at one end, and an opening at the other end for receiving the one end of the insert. At least some of the staves may extend inward from the hoop and the inwardly-extending staves may be resiliently-biased inward. A wire may connect the free ends of the staves. For example, it may be wrapped inside at least some of the inwardly-extending staves. The adapter sleeve may include a frustoconical tip and the connector may further include a conductive disk for abutting free ends of at least some of the staves.

Also disclosed is a connector for coaxial cable including a gripping barrel having a hoop near one end and a plurality of resiliently-biased staves extending from the hoop, at least some of the staves extending inwardly from the hoop; an adapter sleeve for supporting the cable at the one end of the gripping barrel; and a receptacle having a fastener at one end and an opening at the other end for receiving the adapter sleeve. The connector may further include a pin supported in the receptacle at each end by insulating disk and the fastener includes an N-type fitting. A wire may connect the free ends of the staves, and be wrapped inside at least some of the inwardly-extending staves. A conductive material may also be arranged on one of the insulating disks for abutting free ends of at least some of the staves. An elastic band may surround at least some of the inwardly-extending staves.

Also disclosed here is a connector for coaxial cable including a substantively tubular body; an adapter sleeve for supporting the cable in the body; and means for releasable-securing the cable inside the body. The connector may also include means for reducing capacitance in the connector, and/or means, arranged at one end of the body, for securing the body to a fitting.

BRIEF DESCRIPTION OF THE DRAWINGS

These and other aspects of this technology are described here with reference to the following figures ("FIGS.") which are not necessarily drawn to scale, but use the same reference numerals to designate corresponding parts throughout each of the several views and/or embodiments.

FIG. 1 is an exploded diagram of a connector for coaxial cable.

FIG. 2 is an enlarged diagram of the gripping barrel from FIG. 1.

DETAILED DESCRIPTION

Figure 3:
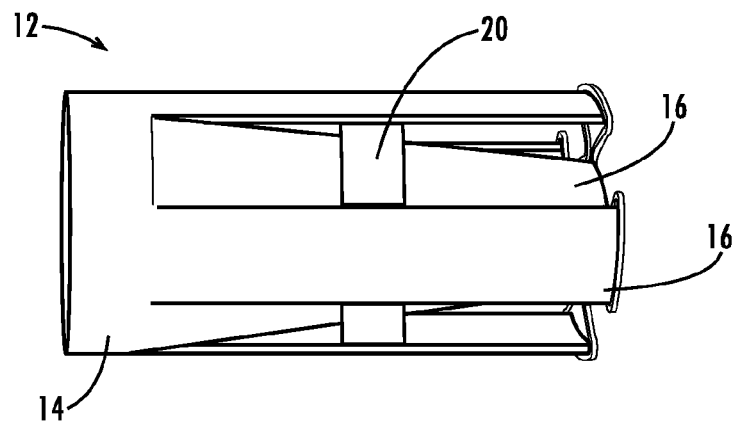
FIG. 3 is a side view of the gripping barrel, elastic band, and drain wire from FIG. 1.

FIG. 1 is an exploded view of one exemplary embodiment of a connector 2 for coaxial cable 1. The illustrated connector 2 includes a substantially tubular body including an insert having an opening at each end, and a receptacle 6 having an opening at one end for receiving the insert 4, and a fastener 8 at the other end. External threads 10 on the insert 4 engage with internal threads (not shown) in the receptacle 6 for securing the insert to the receptacle. However, these thread configurations may be reversed and/or a variety of other mechanisms may also be used for securing the insert 4 to the receptacle 6. The illustrated fastener 8 is a standard N-type connector. However, a variety of other standards may also be implemented using other types of fasteners such as BNC, GR, IEC 169-2, TNC, UHF, MCX, FME, SMA, SMB, SMC, APC-7, DIN, RCA, SCART, and/or other configurations. As discussed in more detail below, components for making the illustrated insert 4 and receptacle 6 have been generally available from Gilbert Engineering of Glendale, Ariz. which is now part of Corning Incorporated.

A gripping barrel 12 is arranged inside in the insert 4 and/or the receptacle 6. As illustrated in FIG. 2, the gripping barrel 12 includes a hoop 14 arranged on one end. However, the hoop may also be spaced from the end of the gripping barrel 12. The gripping barrel 12 also includes a plurality of fingers or staves 16 which extend from the hoop 14. Although eight staves are illustrated in FIG. 2, any other number of staves may also be used. Similarly, although the staves 16 are illustrated as being integrally formed with the hoop 14, the staves may also be formed separately and then secured to the hoop.

Some, or all, of the staves 16 may extend inward from the hoop 14 toward the central axis of the gripping barrel 12. These inwardly-extending staves engage the external surface of the cable 1 which is inserted into the insert 4, through the adapter sleeve 18, and through the hoop 14. The illustrated adapter sleeve 18 may be formed from plastic and/or other materials with a frustoconical tip 19 for inserting into the end of the insert 4 so that it is held in place through a friction of compression fit. The insert 4 is also provided with an axial bore which generally corresponds to the external shape of the adapter sleeve 18, and/or may include a frustoconical shoulder for receiving the leading edge of the frustoconical tip 19 and preventing it from being pushed through the insert 4 and against the gripping barrel 12.

The inwardly-extending staves 16 may be resiliently-biased against the cable 1 inside the connector 2 so as to help secure the cable inside the connector. For example, the gripping barrel 12 may be made from spring steel, aluminum or other material which allows the inwardly-biased staves 16 to be initially deformed into the position shown in FIG. 2. In addition, as shown in FIG. 3, the inwardly-biased staves 16 may be surrounded by an elastic band 20, such as a rubber band 20. The elastic band 20 provides support as needed to grip the cable 1 being tested and to assist in retaining resilient properties of the staves. This configuration also improves maintainability since periodic maintenance through the replacement of the elastic band 20 is a cheaper alternative than replacing the gripping barrel 12.

Figure 4:
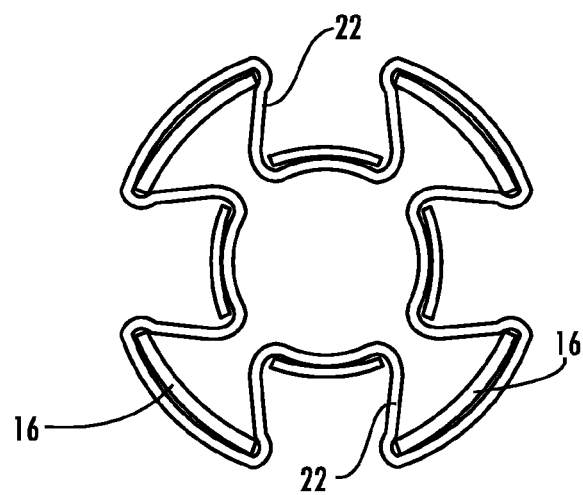
FIG. 4 is an end view of the gripping barrel from FIG. 3.

As illustrated in FIGS. 1, 3, and 4 a drain wire 22 may connect free ends of the gripping barrel 12 for reducing parasitic and/or stray capacitance, and securing the free end of the staves 16. FIG. 4 shows the drain wire 22 wrapped inside the inner surface of the inwardly-extending staves 16 and outside and around the outer surface of the remaining substantially-straight staves 16. This configuration for wrapping the drain wire 22 helps to maintain adequate contact between the drain wire and the staves 16. However, a variety of other drain wire 22 wrapping configurations may also be used. For example, the drain wire 22 may be wrapped around all of the staves 16, merely on the external surface of the substantially-straight staves 16, or between at least one inwardly-extending stave 16 and one substantially straight stave 16.

As best illustrated in FIG. 1 the connector may also be provided with a conductive disk 24 for abutting the free ends of at least some of the staves and further reducing any parasitic or stray capacitance. The edges of the conductive disk 24 may also abut the internal surface of the insert 4 and/or receptacle 6 which are typically grounded.

FIG. 1 also illustrates an optional pin assembly including a pin 26 having a flange 28 for inserting into the insulating disks 30 and 31 which support the pin 26 inside the receptacle 6. The pin 26 and insulating disks 30 and 31 are particularly useful when the fastener 8 is an N-type fastener. In this configuration, a flat surface of one of the disks 30 will rest against a support surface (not shown) inside the receptacle 6 allowing one end of the pin 26 to extend through the hole 32 in the insulating disk 30 so that it protrudes into the pin cavity 34 in the fastener 8.

Figure 5:
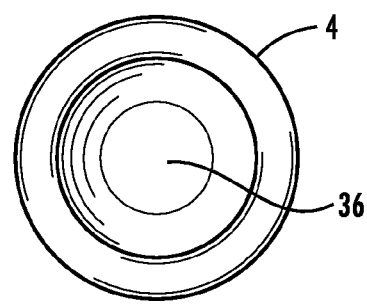
FIG. 5 is an end view of the insert from FIG. 1.

FIG. 5 shows an end view of the insert 4 from the vantage point section line 5-5' in FIG. 1. The diameter of the internal opening 36 generally corresponds to the outer diameter of the adapter sleeve 18, which is also the largest outer diameter of cable anticipated to be used in the connector 2 without the adapter sleeve 18 (typically size F11 drop cable.) However, the device may be configured for any cable size. The internal diameter of the bore 38 through the adapter sleeve 18 corresponds to the cable size for which the connector 2 is being used, typically smaller than size F11 drop cable. Consequently, the connector 2 may be used with a variety of cable sizes by simply choosing the appropriately sized adapter sleeve 18 having a bore 38 which is slightly larger than the prepared end of the cable 1.

Before using the connector 2 with a coaxial cable 1, the front face of the cable is prepared with a clean, and preferably square, cut. The outer jacket of the cable is then removed over approximately the length of the connector 2. Any loose braiding or conducting foil tape is then pulled back and/or removed. The adapter sleeve 18 having a bore 38 corresponding to the size of the exposed dielectric (and any conducting tape that may be bonded to the dielectric) is placed on the end of the insert 4. The cable is then slipped through the bore 38 and opening 36 in the insert 4 until the center conductor of the cable abuts the end of the pin 26 extending through the insulating disk 30. The staves 16 on the gripping barrel 12, as well as the adapter sleeve 18, thus help to guide and stabilize the prepared cable 1 inside the insert 4 and/or receptacle 6.

The connector 2 is sometimes referred to as a "universal drop test connector" since it may be implemented with drop-type cables for making quick and easy connections to a device for testing, such as measuring electrical characteristics like structural loss return. In particular, the connector 2 will accept many sizes of drop cable, including sizes F59, F6, F7, F113, and F11 available from CommScope and/or others depending upon the diameter of bore 38 in the adapter sleeve 18. However, the connector 2 may also be used in other applications, such as field connections, and other cable types, such as trunk or distribution cable.

For many of these and other types of cable, small changes in capacitance/impedance from the connector can often cause significant changes in return loss measurements for the cable. These and other errors are minimized by various aspects of the connector 2, such as the gripping barrel 12, the drain wire 22 and the conductive disk 24, which alone and/or in combination with other features help to reduce stray and/or parasitic capacitance that could otherwise lead to measurement errors.

The connector 2 also provides a significant holding force that allows the operator to complete the test "essentially hands-free," and thus significantly increases the speed of the testing process. The device also increases the life of the test bridges and/or other equipment to which the cables are connected for testing since the fastener 8 may be left connected on the bridge to which a new cable is secured to the testing apparatus. Consequently, there is less downtime caused by bridge failure due to worn parts from constant connector changes. The connector also increases production efficiency because there is no need to change connectors for different size cables. It has also been found that two of the connectors 2 may be used to replace ten standard test connectors at each test station. This can be particularly effective for large testing operation, such as where ten test stations that would otherwise require one hundred conventional test connectors can be operated with only about twenty of the connectors 2 discussed above.

It should be emphasized that the embodiments described above, and particularly any "preferred" embodiments, are merely examples of various implementations that have been set forth here to provide a clear understanding of various aspects of the invention. One of ordinary skill will be able to alter many of these embodiments without substantially departing from scope of protection defined solely by the proper construction of the following claims.

What is claimed is:

1. A test connector of the slip-on design for installation on and removal from a cable end during a testing procedure, such that the test connector is able to be reused on another cable end after removal, said test connector comprising:
an insert having openings at both ends; and
a receptacle having a fastener for attachment to an electrical connector at one end and an opening at an opposite end to align with said openings of said insert,
wherein said insert includes movable fingers, and wherein a plurality of said fingers are resiliently biased to engage an external surface of a cable passing through said openings of said insert to releasably secure the cable to said insert, such that the cable may be inserted into and removed from said insert without damaging said insert, and
wherein said insert includes first threads and said receptacle includes second threads, and wherein said insert is secured to said receptacle by a screwed engagement between said first and second threads, such that said insert may be attached to, and subsequently separated from, said receptacle.

2. The test connector of claim 1, wherein said fingers are attached to a hoop which is held by said insert.

3. The test connector of claim 1, wherein said fingers are formed of spring steel.

4. The test connector of claim 1, wherein said insert includes eight fingers.

5. The test connector of claim 1, wherein an inner diameter of said insert is approximately the same as an outer diameter of an F11 drop cable.

6. The test connector of claim 1, further comprising a pin supported in said receptacle by at least one insulating disk.

7. The test connector of claim 1, wherein said first threads of said insert are external threads formed on an outer surface of said insert and said second threads of said receptacle are internal threads formed on an inner surface of said receptacle.

8. The test connector of claim 1, wherein said fastener of said receptacle forms a standard n-type connector.

9. A test connector of the slip-on design for installation on and removal from a cable end during a testing procedure, such that the test connector is able to be reused on another cable end after removal, said test connector comprising:
an insert having openings at both ends; and
a receptacle having a fastener at one end and an opening at an opposite end to align with said openings of said insert,
wherein said insert includes movable fingers, and wherein a plurality of said fingers are resiliently biased to engage an external surface of a cable passing through said openings of said insert to releasably secure the cable to said insert, such that the cable may be inserted into and removed from said insert without damaging said insert; and further comprising:
an elastic member engaging said plurality of said fingers to cause said plurality of said fingers to be resiliently biased to engage the external surface of the cable passing through said openings of said insert.

10. The test connector of claim 1, wherein said plurality of said fingers are adapted to engage the external surface of a dielectric member beneath a cable jacket, which surrounds a central conductor.

11. The test connector of claim 1, further comprising:
an electrically conductive drain wire electrically connected to at least one of said fingers.

12. The test connector of claim 1, further comprising:
an electrically conductive disk electrically connecting at least two of said plurality of said fingers.

13. The test connector of claim 12, wherein said electrically conductive disk also contacts said insert and said receptacle.

14. The test connector of claim 1, further comprising:
an adapter sleeve having an outer surface shape to permit insertion into said insert, said adapter sleeve including a central bore therethrough to receive a cable, wherein said central bore as an inner shape similar to an outer shape of a cable to be passed therethrough.

15. The test connector of claim 14, wherein a frictional compression fit occurs between said outer surface of said adapter sleeve and an inner surface of said insert when said adapter sleeve is received within said insert.

16. The test connector of claim 14, wherein said adapter sleeve includes an end which abuts a stop surface within said insert to prevent said adapter sleeve from being pushed through said insert.

17. A test connector kit comprising:
an insert having openings at both ends;
a receptacle having a fastener at one end and an opening at an opposite end to align with said openings of said insert, wherein said insert includes movable fingers, and wherein a plurality of said fingers are resiliently biased to engage an external surface of a cable passing through said openings of said insert to releasably secure the cable to said insert, such that the cable may be inserted into and removed from said insert without damaging said insert;
a first adapter sleeve having an outer surface shape to permit insertion into said insert, said first adapter sleeve including a first central bore therethrough, wherein said first central bore has a first diameter to receive a first type of cable; and
a second adapter sleeve having an outer surface shape to permit insertion into said insert to replace said first adapter sleeve when said first adapter sleeve is removed from said insert, said second adapter sleeve including a second central bore therethrough, wherein said second central bore has a second diameter to receive a second type of cable, wherein said second diameter is larger than said first diameter.

18. The test connector kit of claim 17, further comprising:
an elastic member engaging said plurality of said fingers to cause said plurality of said fingers to be resiliently biased to engage the external surface of the cable passing through said openings of said insert.

19. The test connector kit of claim 17, wherein said fastener of said receptacle forms a standard n-type connector.

20. The test connector kit of claim 17, wherein said insert includes first threads and said receptacle includes second threads, and wherein said insert is secured to said receptacle by a screwed engagement between said first and second threads, such that said insert may be attached to, and subsequently separated from, said receptacle.

* * * * *